United States Patent [19]

Chang

[11] Patent Number: 5,554,985
[45] Date of Patent: Sep. 10, 1996

[54] METHOD FOR SCANNING KEYPAD ARCHITECUTRE EMPLOYING POWER SOURCE AND GROUND OF DIGITAL ELECTRONIC DEVICES

[75] Inventor: Chun-Yen Chang, Hsinchu, Taiwan

[73] Assignee: United Microelectronics Corporation, Hsinchu, Taiwan

[21] Appl. No.: 490,310

[22] Filed: Jun. 14, 1995

[51] Int. Cl.$^6$ .................................................. H03K 17/94
[52] U.S. Cl. .............................. 341/26; 341/22; 379/368
[58] Field of Search ....................... 341/26, 22; 379/368; 340/825.79

[56] References Cited

U.S. PATENT DOCUMENTS

| | | | |
|---|---|---|---|
| 4,918,445 | 4/1990 | Bower | 341/26 |
| 5,264,845 | 11/1993 | Kwon et al. | 341/26 |
| 5,430,443 | 7/1995 | Mitchell | 341/22 |
| 5,450,080 | 9/1995 | Irwin | 341/26 |

OTHER PUBLICATIONS

UMC UM91210/30 Series; "Tone/Pulse Dialer"; Page numbers 2–3 through 2–17 (15 pages total).

*Primary Examiner*—Jeffery Hofsass
*Assistant Examiner*—Andrew Hill
*Attorney, Agent, or Firm*—Ladas & Parry

[57] ABSTRACT

A scanning method of keypad architectures utilizing power pin $V_{DD}$ and ground pin GND of an integrated circuit device is disclosed. The integrated circuit device has a number of row pins and column pins, a power pin and a ground pin, and a number of pins for other functions of the integrated circuit device. The row and column pins, power pin and ground pin of the integrated circuit device are connected to respective connections of a keyswitch matrix, which has a plurality of row connections and column connections. The keyswitch matrix of the scanning apparatus has a first one of the row connections connected to the power pin. The keyswitch matrix of the scanning apparatus has a second one of the row connection connected to the ground pin. Each of the other row pins is connected respectively to corresponding one of the row connections. Each of the column pins is connected respectively to corresponding one of the column connections. The scanning scheme is employed to identify the row and column of the key having its key switch depressed. A keyswitch matrix having a total of (M−2)+(N−2) integrated circuit device pins can have a maximum of (M×N)−4 keys in the keypad.

3 Claims, 6 Drawing Sheets

METHOD FOR SCANNING KEYPAD ARCHITECUTRE EMPLOYING POWER SOURCE AND GROUND OF DIGITAL ELECTRONIC DEVICES

BACKGROUND OF THE INVENTION

1. Field of the Invention

The present invention relates in general to a method for scanning a keypad architecture of electronic systems. In particular, the present invention relates to the scanning method of keypad architectures utilizing power pin $V_{DD}$ and ground pin GND of IC devices to minimize the IC pin count while maximizing the number of total keys supported.

2. Technical Background

Figure 1:
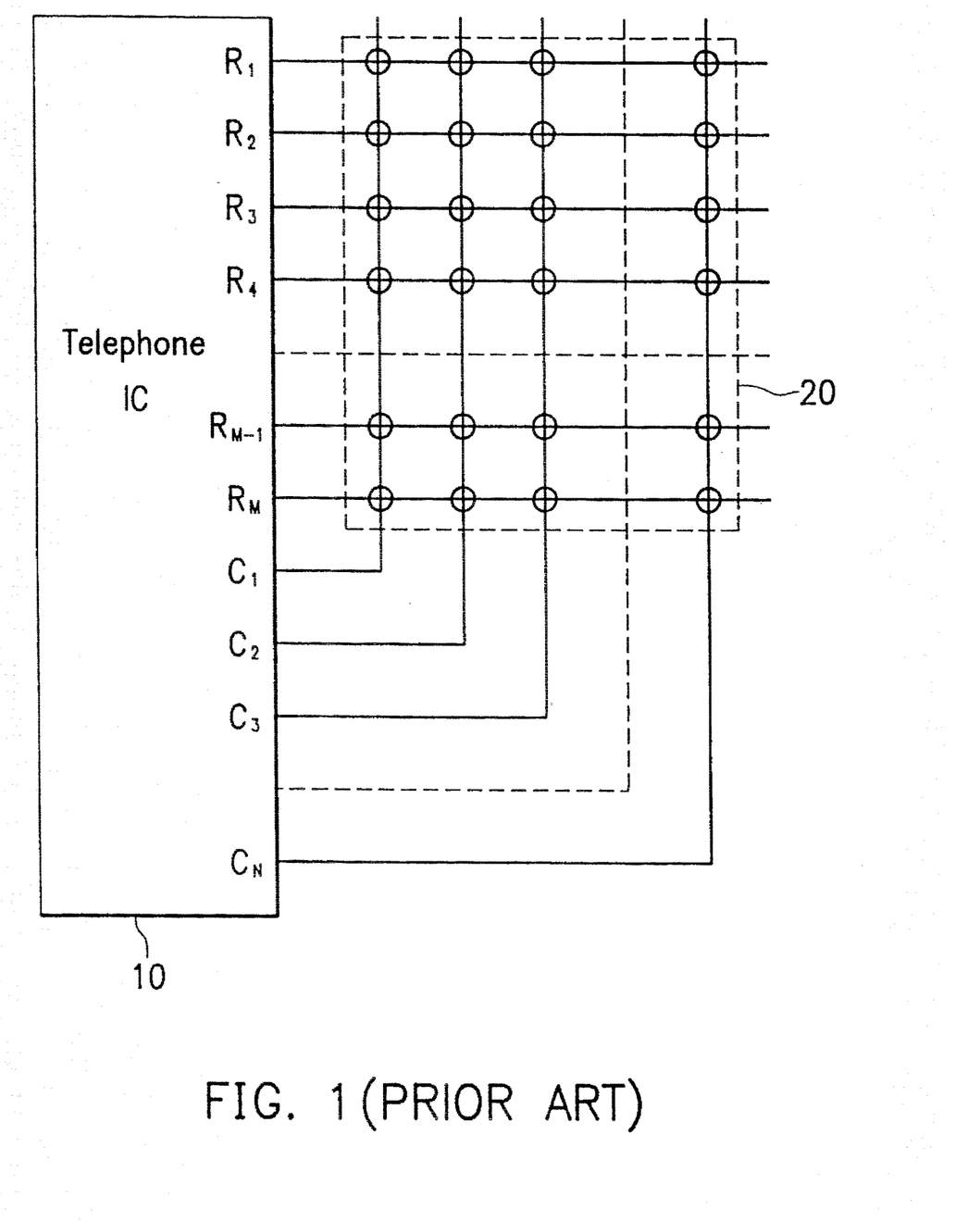
FIG. 1 schematically shows the block diagram of a conventional telephone IC and the keypad it is monitoring.

Schemes for scanning conventional keypads (or, keyboards in certain circumstances) of electronic systems such as telephone sets require the use of a scanning matrix comprising M rows by N columns of scanning signal lines that are handled by the digital circuitry of the system. If an integrated circuit device, herein referred to as IC, of the digital electronic system of a telephone set is responsible for monitoring keypad input, and assuming a M-row by N-column keypad is utilized, then would have to be a total of M+N pins on the IC required to process the scanning signals for the keypad. FIG. 1 shows such a telephone IC 10, and the keypad 20 is monitoring by continuous scanning, using scanning techniques well known in the prior art.

Since the cost of an IC is dependent on the total number of lead pins it has, therefore, an obvious measure which may be used to reduce the cost of the IC used in the electronic system of a telephone set would be to reduce the number of IC pins whenever possible. In a telephone set having a keypad with M-row by N-column inputs, such as is in the case of FIG. 1, wherein M is the number of the scanning rows $R_1, R_2, \ldots, R_M$ and N is the number of the scanning columns $C_1, C_2, \ldots, C_N$, in addition to the M+N pins needed for the scanning of the keypad, there are other signals of the telephone electronic system that need to occupy additional IC lead pins.

Figure 2A:
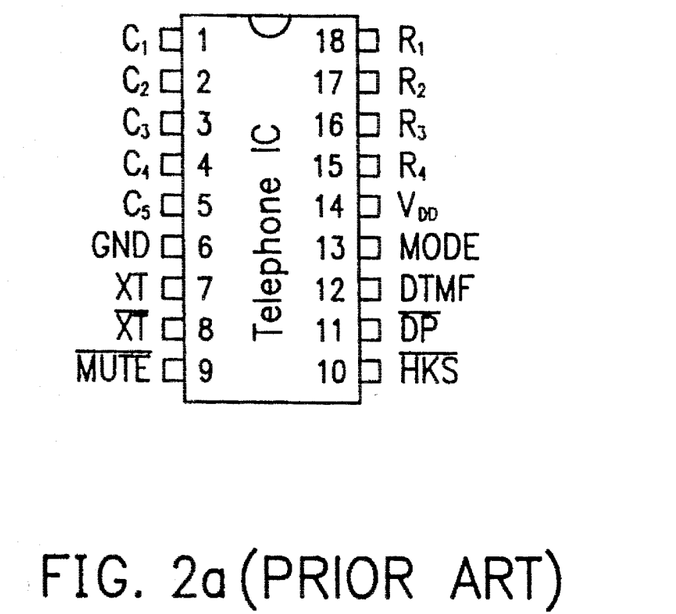
FIG. 2a schematically shows an outline of the pin assignment of a conventional telephone IC.
Figure 2B:
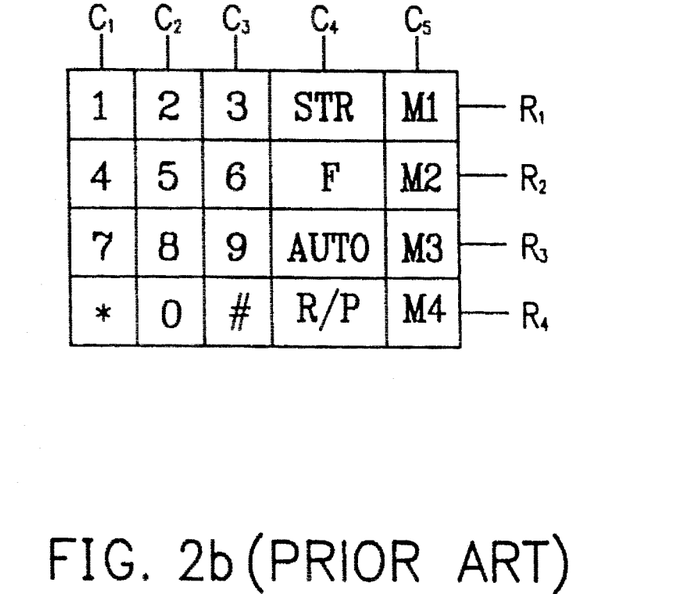
FIG. 2b schematically shows an outline of a typical 4×5 keypad used in a conventional telephone set.

For example, consider the conventional telephone IC and the keypad it scans, as are schematically shown in FIGS. 2a and 2b. The telephone IC schematically outlined as a pin-assignment layout in FIG. 2a has a total of 18 pins. On the other hand, the keypad it scans has a 4-by-5 scanning matrix. The 4-row by 5-column keypad requires nine IC pins, namely $R_1, R_2, R_3$ and $R_4$, as well as $C_1, C_2, C_3, C_4$ and $C_5$ as shown in FIG. 2b. These nine scanning pins (and their associated lines) can handle the twelve common keys found on the typical keypad of a telephone set, namely the 0, 1, 2, ..., 9 keys and the two function keys "#" and "*". In addition, the scanning lines also handle eight other keys, namely the STR, F, AUTO, R/P and M1–M4 keys, which are used for specialized functions.

Of the eighteen pins of the telephone IC in FIG. 2a, nine pins are assigned for the keypad input scanning function and at least two pins are assigned for power and ground connections for the IC. Of the seven remaining pins, two are for the system crystal clock inputs (XT and XT#), one is for mute control (MUTE#), one is for handset status (HKS#), one is for pulse dialing (DP#), one is for audio tone dialing (DTMF), and one is for dialing mode setting (MODE). With these pin assignments, a telephone set can be equipped with the basic functions of a typical telephone system using an eighteen-pin IC. However, when additional telephone set functions are to be added to the system, for example, key-press tone ratio setting, dialing speed setting, speakerphone and/or line hold, etc., additional IC pins are required. This, however, increases the cost of the IC as indicated above.

SUMMARY OF THE INVENTION

It is therefore an object of the present invention to provide a method for increasing keys on a keypad that provides for the saving of the use of a telephone IC pins on the provision of the function input scanning by the electronic system.

In particular, the present invention provides a method for increasing keys on a keypad that provides (M×N)–4 scanned functions while requires only (M–2)+(N–2) scanning lines of the IC lead pins.

The present invention achieves the above indicated objects by providing a method for connecting a keypad to a telephone IC which has a number of row pins and column pins, a power pin and a ground pin, and a number of pins for other functions of the telephone IC. The row and column pins, power pin and ground pin of the telephone IC are connected to respective connections of a keypad, which has a plurality of row connections and column connections. However, the keypad of the scanning scheme has a first one of the row connections connected to the power pin and a second one of the row connection connected to the ground pin. Besides, each of the other row pins is connected respectively to corresponding one of the row connections. Each of the column pins is connected respectively to corresponding one of the column connections. The scanning scheme is employed to identify the row and column of a depressed key on the keypad. However, a keypad only having a total of (M–2)+(N–2) telephone IC pins can have a maximum of (M×N)–4 keys in the keypad.

BRIEF DESCRIPTION OF THE DRAWINGS

Other objects, features and advantages of the present invention will become apparent by way of the following detailed description of the preferred but non-limiting embodiment. The description is made with reference to the accompanied drawings, wherein.

DETAILED DESCRIPTION OF THE PREFERRED EMBODIMENTS

Figure 3:
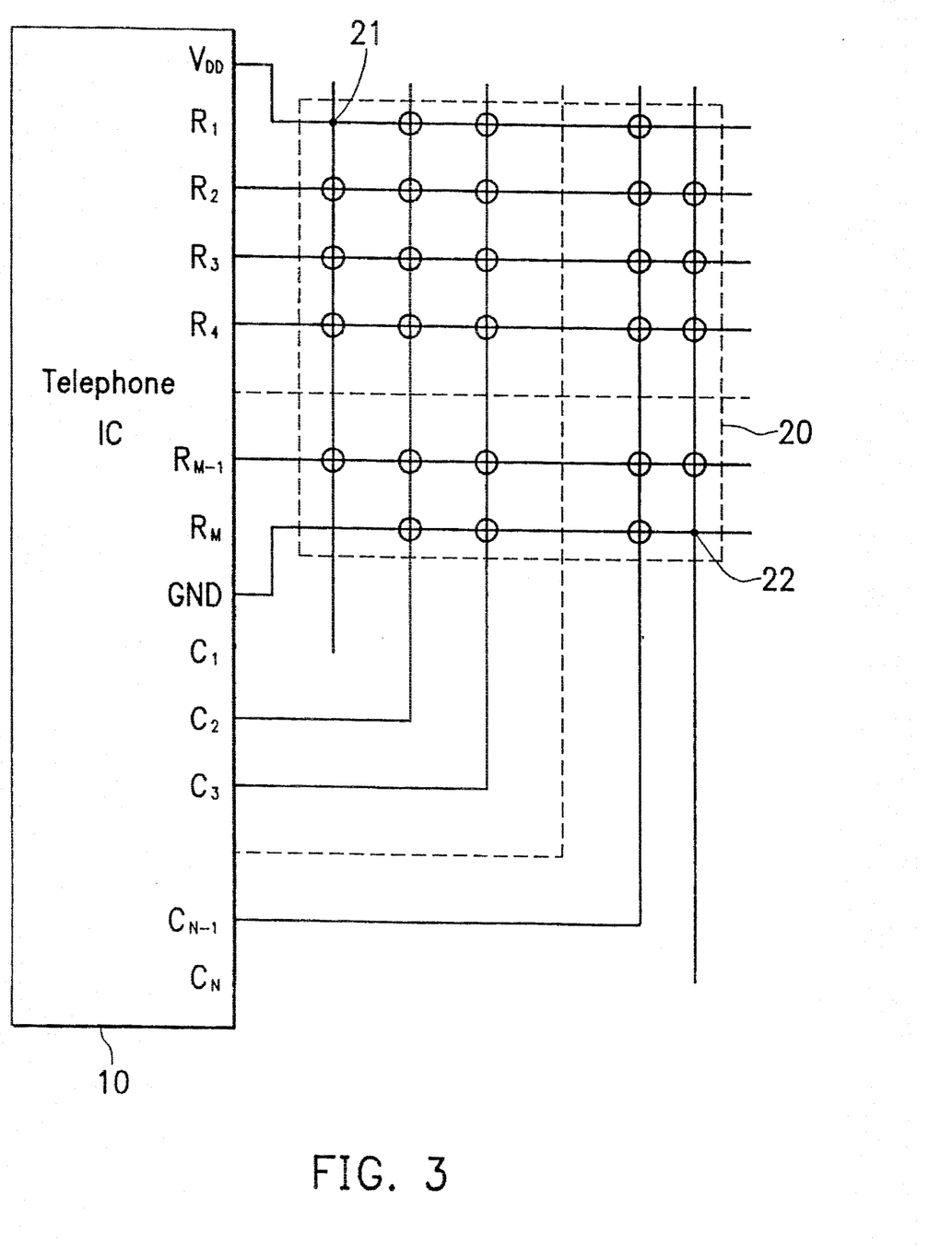
FIG. 3 schematically shows the block diagram of a telephone IC and the keypad monitored in accordance with a preferred embodiment of the present invention.

Refer to FIG. 3, which schematically shows the block diagram of a telephone IC 10 and the keypad 20 monitored in accordance with a first embodiment of the present invention. As shown in the drawing, the telephone IC 10 has a power source pin $V_{DD}$ and a ground pin GND. The IC 10 also has M row-scan pins assigned as pins $R_1, R_2, \ldots, R_{M-1}$ and $R_M$, as well as N column-scan pins assigned as pins $C_1, C_2, \ldots,$ and $C_N$. These M rows and N columns of scanning pins are utilized by the scanning electronic circuitry in the IC 10 to sense the location of the key on a keypad that is depressed by an user.

A keypad 20 is organized as M rows and N columns that correspond to and are also connected respectively to the M row-scanning pins and the N column-scanning pins of IC 10, but with two exceptions to this orderly correspondence, as is described below. The cross points in the matrix 20 as identified by the circles at the row and column line crossovers represent the key switches under the keys on the keypad. The depression of any key in the keypad causes a connection to occur between the corresponding row and column lines over which it is located, and the status of connection (i.e. closed when a key is depressed or open when a key is not depressed) is sensed by the circuitry inside the IC 10. Notice, however, should be directed to the fact that the first row in the matrix 20 is connected to the $V_{DD}$ of the system rather than to the first row-scan pin $R_1$ of the IC 10. Likewise, the last row in the matrix 20 is connected to the GND of the system rather than to the last, namely, the M-th row-scan pin $R_M$ of the IC 10.

Moreover, in the keypad 20, the first column-scan line is connected at point 21 to the first row-scan line which is connected to the power source pin $V_{DD}$, not to a first column-scan pin $C_1$ of the IC 10. Likewise, the last column-scan line, namely, the N-th line is connected at point 22 to the M-th row-scan line which is connected to the ground pin GND, not to the last column-scan pin $C_N$ of the IC 10.

Within this IC 10 and keypad 20 configuration, a total of (M−2)+(N−2) IC pins are utilized for the scanning of (M×N)−4 keys in the keypad. The reason for four keys less is because of the limitation in this scheme that the four physical corners of the key scanning matrix can not have keys present, due to the fact that $V_{DD}$ and GND of the system can never be short-circuited, as well as the fact that a $V_{DD}$ to $V_{DD}$ and a GND to GND connection can have no means to be detected. In the electronic circuitry of the telephone set system, as partially outlined in FIG. 3, the method for scanning the keypad input status comprises the following steps:

(1) First, row I/O pins $R_2, R_3, \ldots, R_{M-1}$ are set to function as output ports, while column I/O pins $C_2, C_3, \ldots, C_{N-1}$ are set as the input ports. Row I/O pins $R_2, R_3, \ldots, R_{M-1}$ are set to output low level signals. Moreover, each of the row I/O pins can be connected to a power supply voltage, for example, by a PMOS transistor and connected to a ground voltage by a NMOS transistor. The gates of the PMOS transistor and the NMOS transistor can be connected to a control signal. As a result, each of the row I/O pins can be set to output high or low level signal in accordance with the level of the corresponding control signal.

(2) Next, the IC 10 of the telephone set electronic circuitry senses the electrical status of the column I/O pins $C_2, C_3, \ldots, C_{N-1}$, which are set to function as inputs. If all are in the floating state, it is determined that no keys located at one of the columns between the second column and the (N−1)-th column (i.e., the last column but one) of the keypad is being depressed. If an electrical high level is detected, that indicates that a key is being depressed in the first row, $R_1$. If an electrical low level is detected, that indicates that the key being depressed is located at one of the rows between the second row and the M-th row (or the last row). Furthermore, the detection of the keys located at the first and last columns is carried out at a latter step.

(3) Then, if it is found that the depressed key is located at one of the rows between the second row and the M-th row of the keypad, but can not be identified which row it is. The row I/O pins $R_2, R_3, \ldots, R_{M-1}$ are again set to function as output ports and outputs electrical high level signals subsequently from the second row to the (M−1)-th row. At the same time, the column I/O pins $C_2, C_3, \ldots, C_{N-1}$ are set as the input ports, whose inputs are monitored. If any of the column I/O pins are sensed to be electrical high level, it can then be decided that the depressed key is located at one of the row I/O pins outputting the electrical high level signals. Otherwise, it can be decided that the depressed key is located at the M-th row, which indicates that the depressed key is being short-circuited to the ground of the system by the press of the key on the keypad by an user. When the row that the depressed key locates at is identified utilizing the scheme as described above, a whole similar scheme can then be performed on the columns of the keypad, until the column that the depressed key locates at is also identified.

Certainly, in the step (2), when it is decided that the depressed key is in the first row, the process can then be directly switch to the procedure for identifying the column as described above.

Although may be obvious to persons skilled in this art, it should still be pointed out that the above described process of setting the row/column pins of the IC to output high and low level signals, and sensing and deciding the electrical level of the sensed row and column, are all performed well within the time period for pressing and releasing a key on the keypad. This should make no problem to the present invention since all typical digital electronic systems of the present day are driven by a clock source oscillating at frequencies in the tens of the kilo hertz range. Hence, during the debounced period of a key being depressed, the scanning cycle of the electrical system of the telephone set can be stably proceeded more than several tens to hundreds of cycles.

(4) A set of procedural steps similar to the one list above in (1) to (3) is then proceeded for the identification of the column on which the key is depressed. However, in this procedure, the column I/O pins $C_2, C_3, \ldots, C_{N-1}$ are set to function as output ports and the row I/O pins $R_2, R_3, \ldots, R_{M-1}$ are set to input ports instead. Accordingly, the status of the keys located at the first column and the last column can be detected.

The scanning scheme, as employed in this first embodiment of the present invention described above, which is utilized to locate the row and column that a key in the keypad of an exemplifying telephone set is depressed, provides for the most number of key assignments possible with the less IC pins used. In terms of practical technical requirements, this scanning-scheme requires telephone IC to have the ability to detect three states in an electronic circuit. They are (1) a short-circuit to the power supply voltage, $V_{DD}$, of the system; (2) a short-circuit to the ground voltage, GND, of the system; and (3) a circuit floating state. Further, the circuitry of the telephone set system must have the ability to set IC pins as input and output ports when required as described above. In other words, I/O port circuitries are required in the IC. Modern microprocessors typically feature the two functionalities as outlined above. It should be noted that there is no further description for the telephone IC above because many different conventional telephone ICs could be alternatively used, for example, the telephone IC numbered UM91210/30C which is produced by the United Microelectronics Cooperation, Taiwan, etc.

Figure 4:
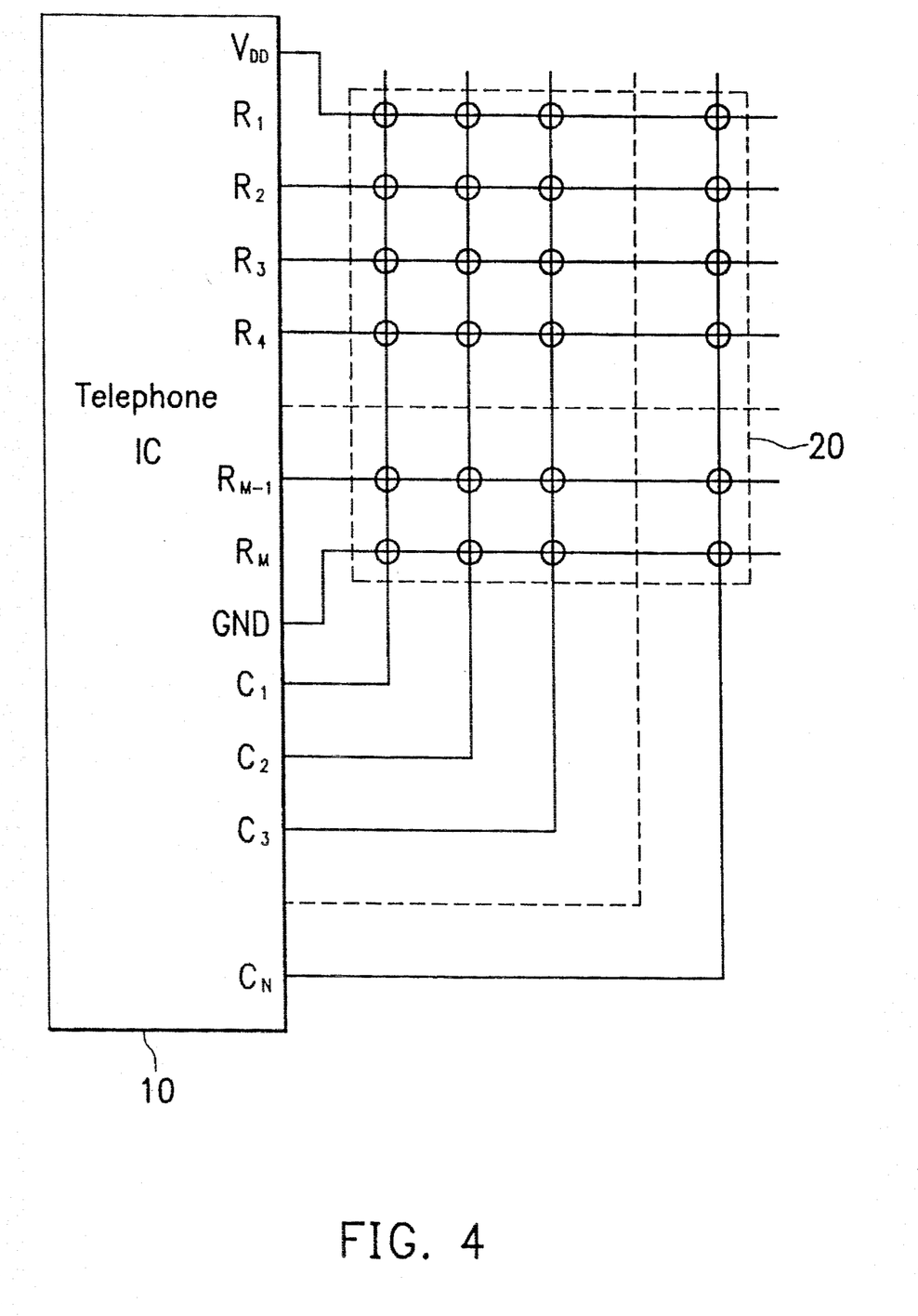
FIG. 4 schematically shows the block diagram of a telephone IC and the keypad monitored in accordance with another preferred embodiment of the present invention.

Refer next to FIG. 4 of the drawing. The drawing schematically shows the block diagram of a telephone IC and the keypad monitored in accordance with a second embodiment of the present invention. As shown the drawing, the telephone IC 10 has a power source pin $V_{DD}$ and a ground pin GND. The IC 10 also has M row-scan lines assigned as pins $R_1, R_2, \ldots, R_{M-1}$ and $R_M$, as well as N column-scan lines assigned as pins $C_1, C_2, \ldots,$ and $C_N$. As is described in the first embodiment, these M row and N column of scanning lines are utilized by the scanning electronic circuitry in the IC 10 to sense the location of the key on a keypad that is depressed by an user.

A keypad 20 is organized as M rows and N columns that correspond to and also connected respectively to the M row-scanning pins and the N column-scanning pins of the IC 10, but with a pair of exception to this orderly correspondence in the M rows as described below. The cross points in the matrix 20 as identified by the circles at the row and column line cross-overs represent the keyswitches under the keys in the keypad. The depress of any key in the keypad makes a switch-on short circuit of the row and column at which the key locates, and the status of short circuit is sensed by the circuitry inside the IC 10. Notice, however, should be directed to the fact that the first row in the matrix 20 is connected to the $V_{DD}$ of the system rather than to the first row-scan pin $R_1$ of the IC 10. On the other hand, the last row in the matrix 20 is connected to the GND of the system rather than to the last row-scan pin, namely, the M-th row-scan pin $R_M$ of the IC 10.

On the other hand, in the keypad 20, all the N columns of the keypad are orderly connected to the N column-scanning pins of the IC 10, unlike in the case of the first embodiment as described above.

Within this IC and scanning matrix configuration, a total of (M–2)+N IC pins are utilized for the scanning of (M×N) keys in the keypad. In the electronic circuitry of the telephone set system, as partially outlined in FIG. 4, the scanning of the keypad input status is proceeded in the following way.

(1) First, row I/O pins $R_2, R_3, \ldots, R_{M-1}$ are utilized as output ports, while column I/O pins $C_2, C_3, \ldots, C_{N-1}$ are as input ports. Each of the column I/O pins $C_2, C_3, \ldots, C_{N-1}$ are monitored for the electrical input status. If all the column input pins are sensed to be in the floating state, then there is not any key in the keypad depressed. If any of the input column pins is sensed to be in a high electrical level, then a key in the first row, which is tied to the $V_{DD}$, has been depressed. A column sense scheme is then performed to locate the column on which a key in the first row of pins has been depressed.

(2) If any of the input column pins is sensed to be in a low electrical level, then a key in that column pin is being depressed. In this case, a scheme of sequentially changing the electrical states of the row output pins $R_2, R_3, \ldots, R_{M-1}$ from low level to high can be utilized to sense which of the row output pins is involved in the key depress in the keypad.

In this second embodiment as outlined in FIG. 4, all the row pins of the IC are utilized as constant output pins while all the column pins are utilized as constant input pins. No bi-directional I/O circuitry is required for both the row and column sets of pins for the IC 10.

In either of the above-described embodiments, the keys in the keypad of the telephone set are arranged so that the simultaneous depressing of two neighboring keys would not result in the direct short-circuit of the $V_{DD}$ and GND of the telephone set. However, the arrangements of row and column pin assignment of the IC 10 cannot avoid a power-ground short circuit when an intended depressing of more than one key in the keypad, for example in the case of simultaneously depressing of all keys in the keypad, occurs.

To avoid this intentional erroneous key depressing such as may happen in the case of a child playing with the telephone set, two more embodiments of the present invention which are provided in FIGS. 5 and 6 and described below.

Figure 5:
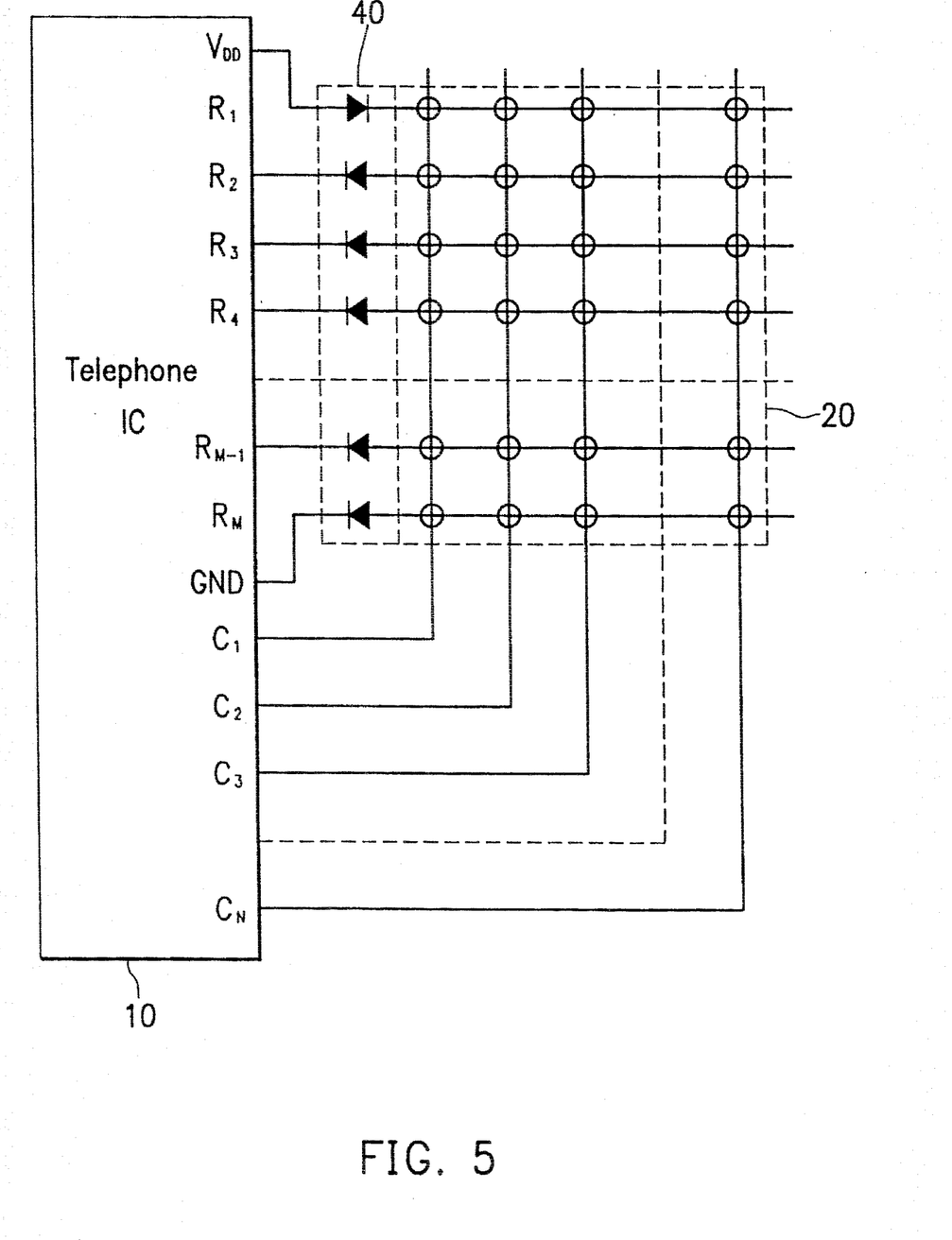
FIG. 5 schematically shows the block diagram of a telephone IC and the keypad monitored in accordance with still another preferred embodiment of the present invention.

Refer to FIG. 5. In this embodiment, one diode 40 such as 1N4148 is inserted in the connecting path between each of the row output pins $R_2, R_3, \ldots, R_{M-1}$ and the contact switch nearest to the IC 10, having a diode orientation as shown in the drawing. In particular, the diodes are directing current flowing into the row output pins, and blocking the current that flows out of the IC 10, as normally would be in the case of a digital electric input and output pair. The diode connected to the GND pin of the IC 10 also has the same orientation as that of the other diodes described above. The only exception of the diode orientation is the diode connected to $V_{DD}$ of the IC 10.

With this arrangement, even if the key on the row being connected to $V_{DD}$ and the key on the row being connected to the GND of the IC 10 are depressed simultaneously, and unfortunately they are on the same column pin of the IC, then the forward bias voltage drops of the two diodes 40 in that particular column pin can ensure that the IC would not be damaged while still maintain normal operation.

Figure 6:
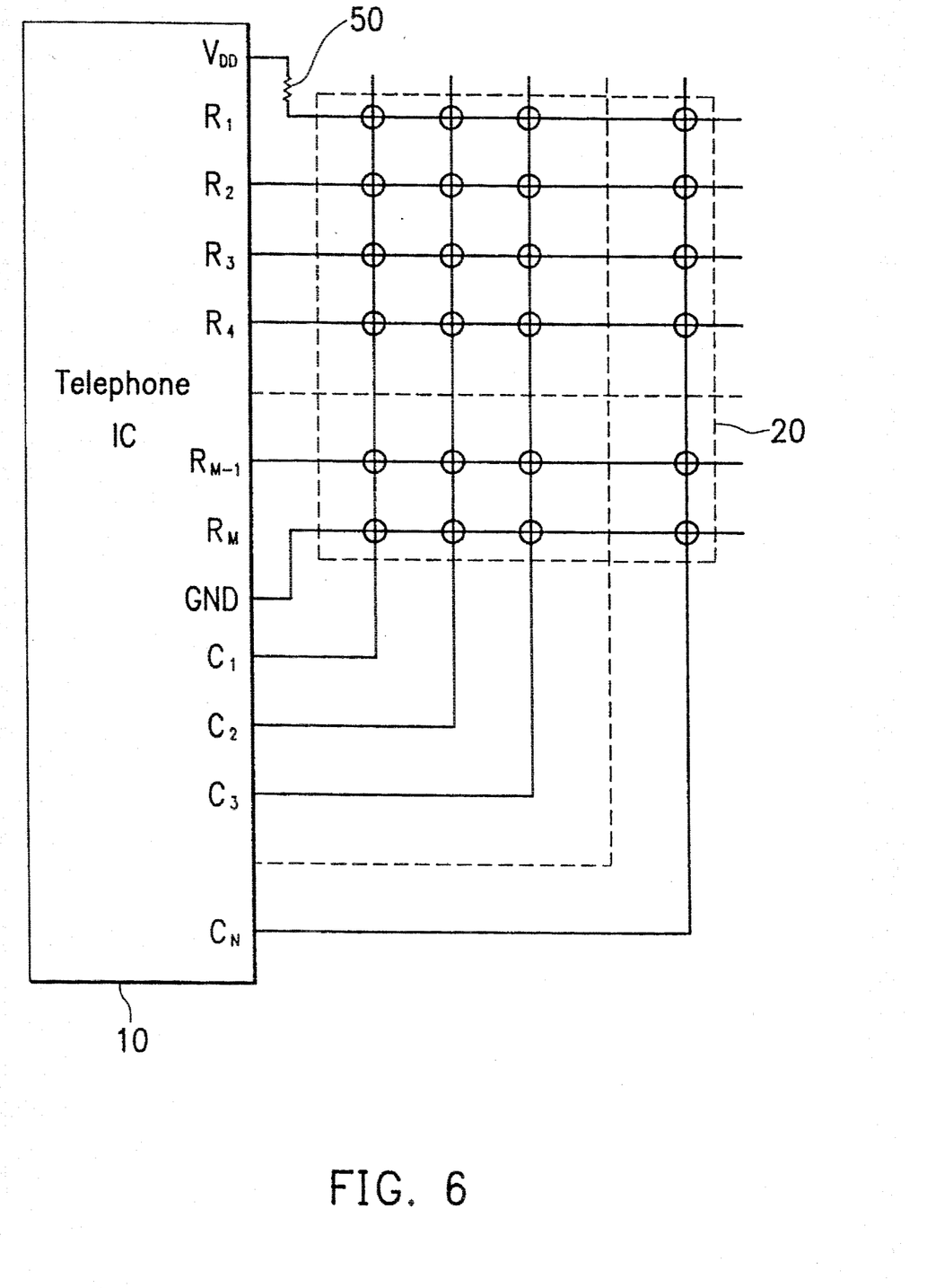
FIG. 6 schematically shows the block diagram of a telephone IC and the keypad monitored in accordance with yet another preferred embodiment of the present invention.

Refer next to FIG. 6 of the drawing. In this embodiment, only one resistor 50 with proper resistance value is inserted between the $V_{DD}$ of the telephone set and the first row output pin connection that leads to the keys on the first row which were connected directly to the $V_{DD}$. With the presence of this resistor 50, even if the key on the row that is connected to $V_{DD}$ and the key on the row that is connected to the GND of the IC 10 are depressed simultaneously, and unfortunately they are on the same column pin of the IC, then the voltage drop across the resistor 50 can ensure that the IC would not be damaged while still maintain normal operation.

For this embodiment, the proper resistance value of resistor 50 can be selected to allow the IC 10 of the telephone set to function normally, when the situation of an intended connection of the $V_{DD}$ and GND via the resistor 50 arises. This means that the resistance value of the resistor 50 can not be too small, draining most of the IC current from $V_{DD}$ to ground, and further dropping the $V_{DD}$ voltage as is normally the case in the typical digital telephone set IC's. On the other hand, the resistance value of the resistor 50 can not be selected to be too large. An unsuitably high resistance of the resistor 50 would limit the current that can be sensed by the column input pins $C_1, C_2, \ldots, C_N$.

Notice should be taken that although the present invention has utilized telephone electronics and the relatively smaller keypad they normally incorporated as the preferred embodiment for the purpose of clarity in the description of the present invention, however, it should be pointed out the present invention is equally applicable to more sophisticated digital electronic systems such as, for example, the keyboards for microcomputer systems.

What is claimed is:

1. A method for key-press scanning of keys in the keypad of digital electronic devices, said digital electronic devices having a digital electronic circuitry contained in an integrated circuit device having a plurality of row pins and column pins, a power pin and a ground pin, wherein a first row connection of a keyswitch matrix is connected to said power pin, a second row connection of said keyswitch matrix is connected to said ground pin, and each of all other row connections of said keyswitch matrix are connected to corresponding one of said row pins, and a first column connection of said keyswitch matrix is connected to said power pin, a second column connection of said keyswitch matrix is connected to said ground pin, and each of all other column connections are connected to corresponding one of said column pins, said method comprising the steps of:

(1) said row pins are set to function as output ports, while said column pins are set as the input ports, and said row pins are set to output low status signals;

(2) said digital integrated circuitry senses the electrical status of said column pins, when all of said column pins are in the floating state, it is determined that no keys in the keypad is pressed, when an electrical high status is detected, it is determined that the key pressed is on the first row, and when an electrical low status is detected, it is determined that the key pressed is on one of the rows of in the second to the last of said row;

(3) when the pressed key is in the second to the last row, the row pins are again set to function as output ports and outputs electrical high status signals subsequently from the second to the last row, while said column pins are set as input ports and monitored; when any of said column pins are sensed to be in its electrical high status, it is decided that the key pressed is in the row pin that is outputting the electrical high signal; otherwise it is decided that the pressed key is on the last row;

(4) said column pins are set to function as output ports, while said row pins are set as the input ports, and said column pins are set to output low status signals;

(5) said digital integrated circuitry senses the electrical status of said row pins, when an electrical high status is detected, it is determined that the key pressed is on the first column, and when an electrical low status is detected, it is determined that the key pressed is on one of the columns in the second to the last of said column; and (6) when the pressed key is in the second to the last column, the column pins are again set to function as output ports and outputs electrical high status signals subsequently from the second to the last column, while said row pins are set as input ports and monitored locate the column in which the key is depressed.

2. The method for key-press scanning of keys of claim 1 further comprising the following step which is prior to the step (1) of connecting a first diode in series between said power pin of said integrated circuit device and said first one of said plurality of row connections in said keyswitch matrix, connecting a second diode in series between said ground pin of said integrated circuit device and said second one of said plurality of row connections in said keyswitch matrix, and connecting a plurality of additional diodes in one-to-one correspondence between said row pins and said corresponding row connections.

3. The method for key-press scanning of keys of claim 1 further comprising the following step which is prior to the step (1) of connecting a resistor in series between said power source pin of said integrated device and said first one of said plurality of row connections in said keypad.

\* \* \* \* \*